United States Patent
Watanabe et al.

(10) Patent No.: US 11,935,750 B2
(45) Date of Patent: Mar. 19, 2024

(54) METHOD FOR PRODUCING SEMICONDUCTOR DEVICE

(71) Applicant: Kioxia Corporation, Tokyo (JP)

(72) Inventors: Kei Watanabe, Yokkaichi Mie (JP);
Toshiyuki Sasaki, Yokkaichi Mie (JP);
Soichi Yamazaki, Yokkaichi Mie (JP);
Shunsuke Ochiai, Yokkaichi Mie (JP);
Yuya Matsubara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 425 days.

(21) Appl. No.: 17/184,828

(22) Filed: Feb. 25, 2021

(65) Prior Publication Data
US 2021/0335610 A1    Oct. 28, 2021

(30) Foreign Application Priority Data

Apr. 27, 2020 (JP) .................................. 2020-078531

(51) Int. Cl.
*H01L 21/033* (2006.01)
(52) U.S. Cl.
CPC ................................ *H01L 21/0332* (2013.01)
(58) Field of Classification Search
None
See application file for complete search history.

(56) References Cited

U.S. PATENT DOCUMENTS

| | | | |
|---|---|---|---|
| 9,589,799 B2 | 3/2017 | Reddy et al. | |
| 2005/0064724 A1* | 3/2005 | Sugino | H01L 21/76829 |
| | | | 438/783 |
| 2009/0115060 A1* | 5/2009 | Mahler | H01L 23/3171 |
| | | | 257/E23.141 |
| 2009/0224293 A1* | 9/2009 | Miyanami | H01L 21/76832 |
| | | | 257/E21.409 |
| 2016/0071957 A1* | 3/2016 | Oshiki | H01L 21/32134 |
| | | | 438/703 |
| 2017/0186766 A1 | 6/2017 | Kitao et al. | |
| 2021/0218110 A1* | 7/2021 | Lanning | H01M 50/414 |

FOREIGN PATENT DOCUMENTS

JP    6527677 B2    6/2019

OTHER PUBLICATIONS

A.C. Ferrari et al., "Interpretation of Raman spectra of disordered and amorphous carbon," Physical Review B, May 2000, vol. 61, No. 20, pgs. (13 total).

* cited by examiner

*Primary Examiner* — Mounir S Amer
(74) *Attorney, Agent, or Firm* — Foley & Lardner LLP

(57) ABSTRACT

A method for producing a semiconductor device includes forming, on a substrate, a film to be processed. The method further includes forming, on the film to be processed, a first film containing a metallic element and a second film containing at least one of carbon or boron. The method further includes forming an insulating film on the first and second films. The method further includes processing the film to be processed using the first film, the second film, and the insulating film, as a mask.

19 Claims, 9 Drawing Sheets

US 11,935,750 B2

METHOD FOR PRODUCING SEMICONDUCTOR DEVICE

CROSS-REFERENCE TO RELATED APPLICATION(S)

This application is based upon and claims the benefit of priority from Japanese Patent Application No. 2020-078531, filed Apr. 27, 2020, the entire contents of which are incorporated herein by reference.

FIELD

Embodiments described herein relate generally to a method for producing a semiconductor device.

BACKGROUND

When a film to be processed on a substrate is processed using a mask layer, for example, when the film to be processed is etched using a hard mask layer, the mask layer may cause warpage of the substrate, which becomes a problem.

DETAILED DESCRIPTION

Figure 1:
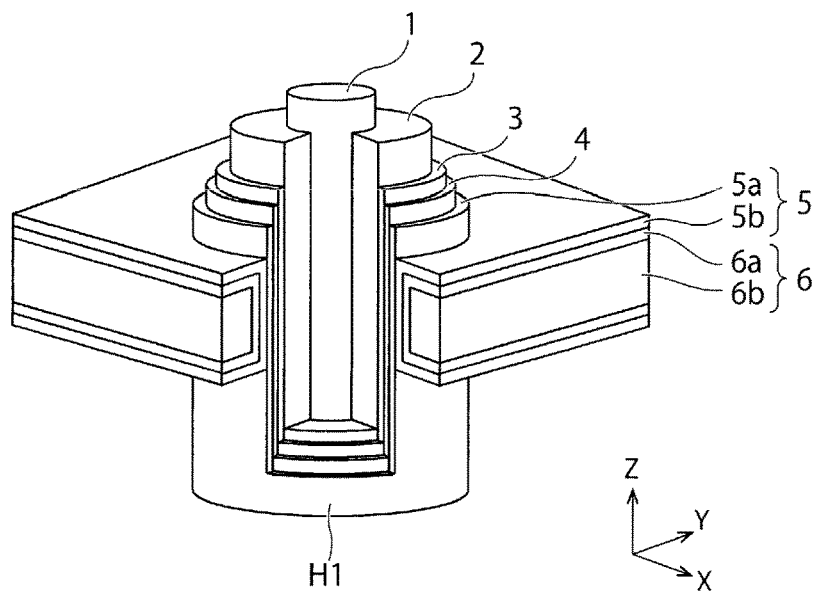
FIG. 1 is a sectional view showing the structure of a semiconductor device of a first embodiment.

At least one embodiment provides a method for producing a semiconductor device, which can prevent warpage of a substrate.

In general, according to at least one embodiment, a method for producing a semiconductor device includes forming, on a substrate, a film to be processed. The method further includes forming, on the film to be processed, a first film containing a metallic element and a second film containing at least one of carbon or boron. The method further includes forming an insulating film on the first and second films. The method further includes processing the film to be processed using the first film, the second film, and the insulating film, as a mask.

Hereinafter, embodiments will be described with reference to the drawings. In FIGS. 1 to 10, the same element is denoted by the same reference numeral or sign, and overlapping explanations are omitted.

First Embodiment

FIG. 1 is a sectional view showing the structure of a semiconductor device of a first embodiment. The semiconductor device of FIG. 1 may be a three-dimensional NAND memory, for example.

The semiconductor device of FIG. 1 includes a core insulating film 1, a channel semiconductor layer 2, a tunnel insulating film 3, a charge storage layer 4, a block insulating film 5, and an electrode layer 6. The block insulating film 5 includes an insulating film 5a and an insulating film 5b. The electrode layer 6 includes a barrier metal layer 6a and an electrode material layer 6b.

In FIG. 1, a plurality of electrode layers and a plurality of insulating layers are alternately stacked on a substrate, and a memory hole H1 is provided in these electrode layers and insulating layers. FIG. 1 shows one electrode layer 6 of these electrode layers. These electrode layers function as, for example, word lines of the NAND memory. FIG. 1 shows an X direction and a Y direction, which are parallel to the front surface of the substrate and perpendicular to each other, and a Z direction which is perpendicular to the front surface of the substrate. In the present specification, a +Z direction is treated as an upward direction and a −Z direction is treated as a downward direction. The −Z direction may coincide with the direction of gravity; the −Z direction need not coincide with the direction of gravity.

The core insulating film 1, the channel semiconductor layer 2, the tunnel insulating film 3, the charge storage layer 4, and the insulating film 5a are formed in the memory hole H1 and constitute a memory cell of the NAND memory. The insulating film 5a is formed on the front surfaces of the electrode layers and the insulating layers in the memory hole H1, and the charge storage layer 4 is formed on the front surface of the insulating film 5a. The charge storage layer 4 can store charge between an outer side surface and an inner side surface. The tunnel insulating film 3 is formed on the front surface of the charge storage layer 4, and the channel semiconductor layer 2 is formed on the front surface of the tunnel insulating film 3. The channel semiconductor layer 2 functions as a channel of the memory cell. The core insulating film 1 is formed in the channel semiconductor layer 2.

The insulating film 5a is a silicon oxide film (a $SiO_2$ film), for example. The charge storage layer 4 is a silicon nitride film (a SiN film), for example. The charge storage layer 4 may be a polysilicon layer. The tunnel insulating film 3 is a $SiO_2$ film, for example. The channel semiconductor layer 2 is a polysilicon layer, for example. The core insulating film 1 is a $SiO_2$ film, for example.

The insulating film 5b, the barrier metal layer 6a, and the electrode material layer 6b are formed between adjacent insulating layers and are formed in turn on the lower surface of an upper insulating layer, the upper surface of a lower insulating layer, and the side surface of the insulating film 5a. The insulating film 5b may be a metallic insulating film such as an aluminum oxide film (an $Al_2O_3$ film), for example. The barrier metal layer 6a is a titanium nitride film (a TiN film), for example. The electrode material layer 6b is a tungsten (W) layer, for example.

FIGS. 2 to 9 are sectional views showing a method for producing the semiconductor device of the first embodiment.

Figure 2:
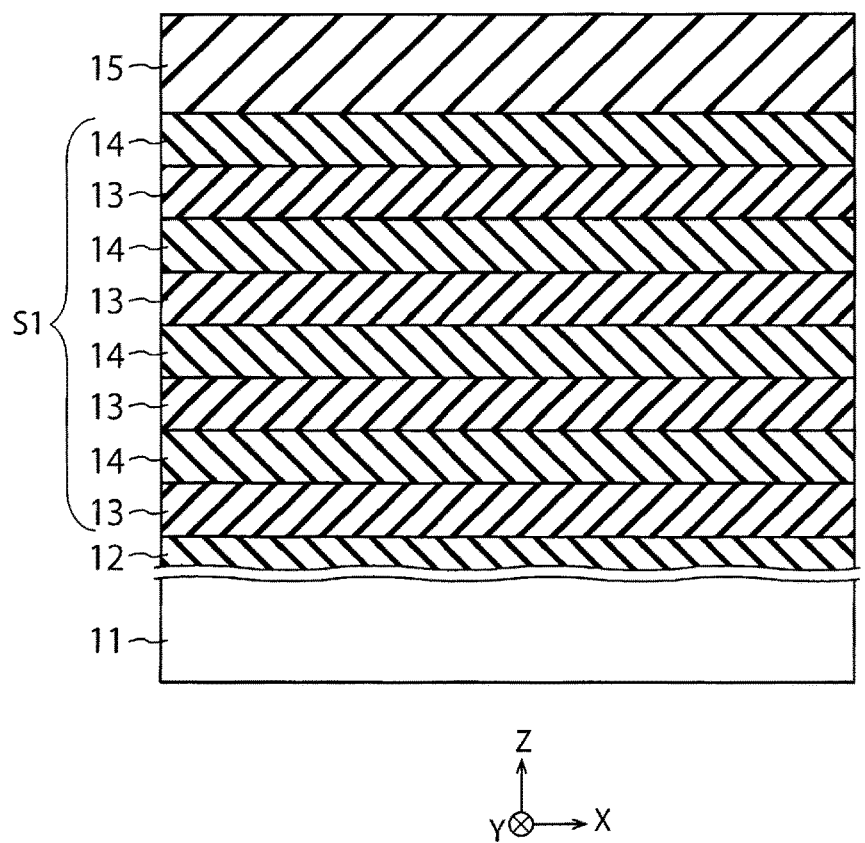
FIG. 2 is a sectional view (1/8) showing a method for producing the semiconductor device of the first embodiment.

First, an interlayer insulating film 12 is formed on a substrate 11, and a plurality of sacrifice layers 13 and a plurality of insulating layers 14 are alternately formed on the interlayer insulating film 12 (FIG. 2), whereby a stacked film S1 alternately including the sacrifice layers 13 and the insulating layers 14 is formed on the interlayer insulating film 12. Next, an interlayer insulating film 15 is formed on the stacked film S1 (FIG. 2). The interlayer insulating film 12, the stacked film S1, and the interlayer insulating film 15 are examples of a film to be processed.

The substrate 11 is a semiconductor substrate such as a silicon substrate, for example. The interlayer insulating film 12 is a $SiO_2$ film, for example. The interlayer insulating film 12 may be formed directly on the substrate 11 or formed on the substrate 11 with another layer sandwiched therebetween. Each sacrifice layer 13 is a SiN film, for example. Each insulating layer 14 is a $SiO_2$ film, for example. The interlayer insulating film 15 is a $SiO_2$ film, for example.

Figure 3:
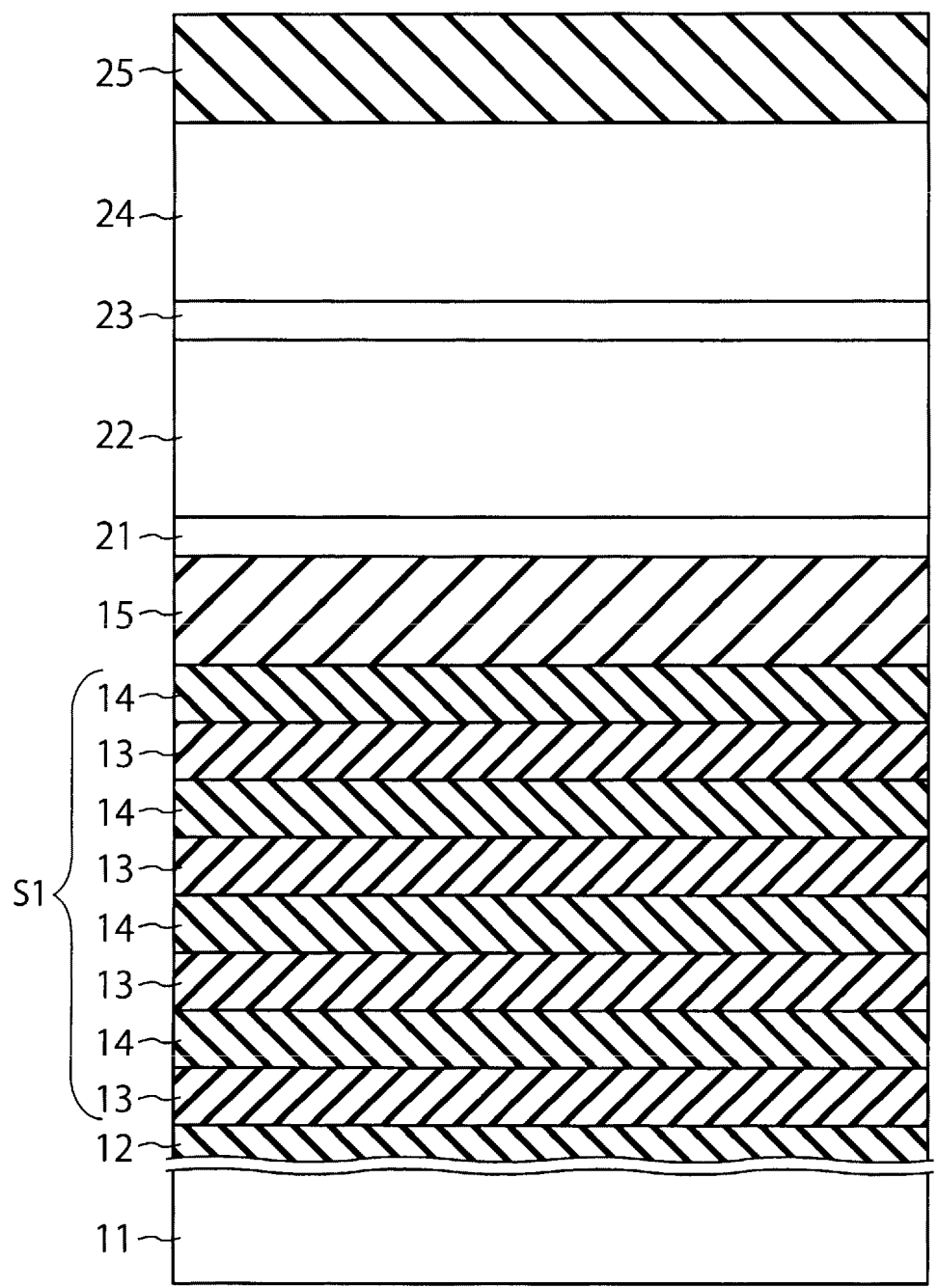
FIG. 3 is a sectional view (2/8) showing the method for producing the semiconductor device of the first embodiment.
Figure 4:
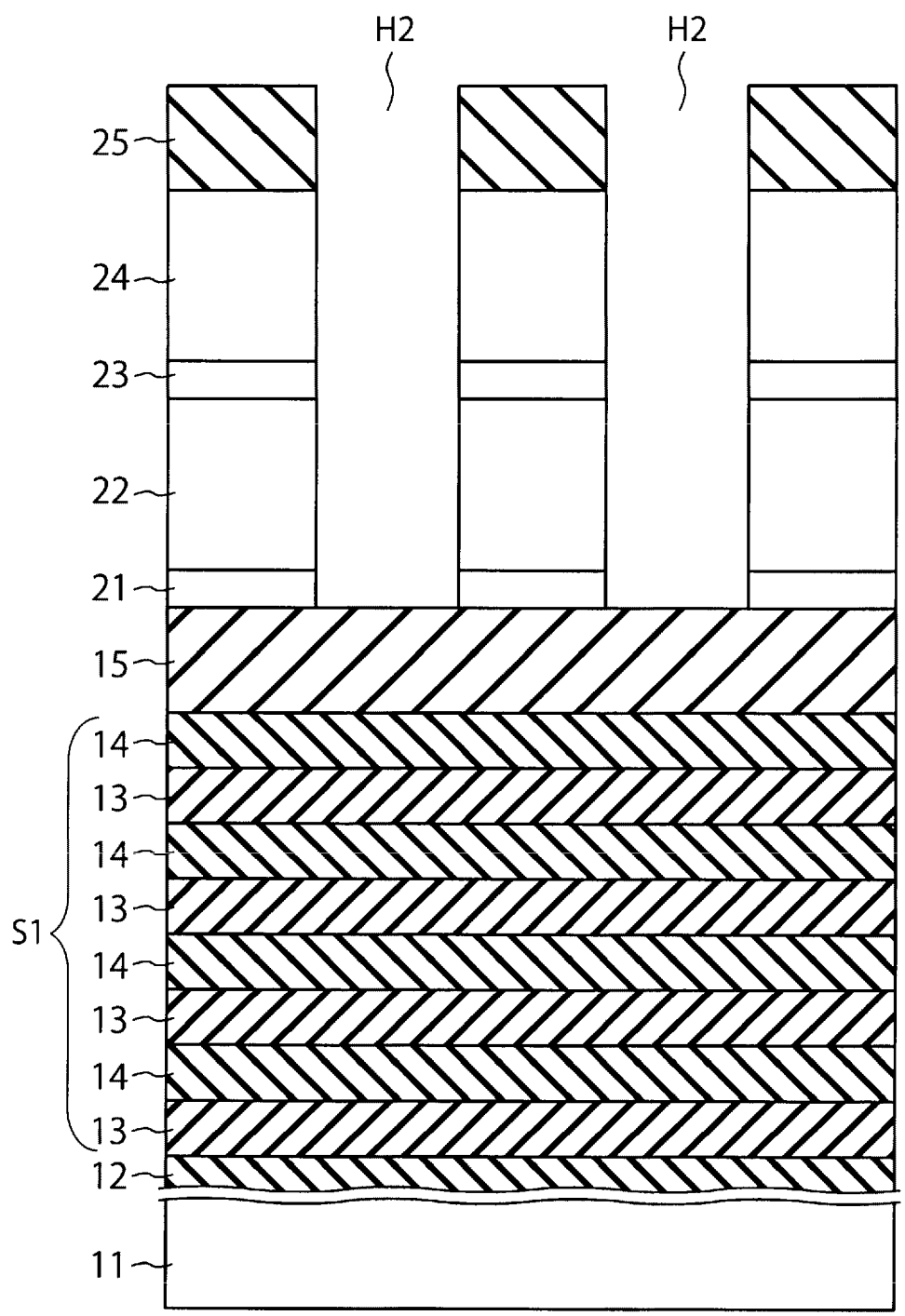
FIG. 4 is a sectional view (3/8) showing the method for producing the semiconductor device of the first embodiment.
Figure 5:
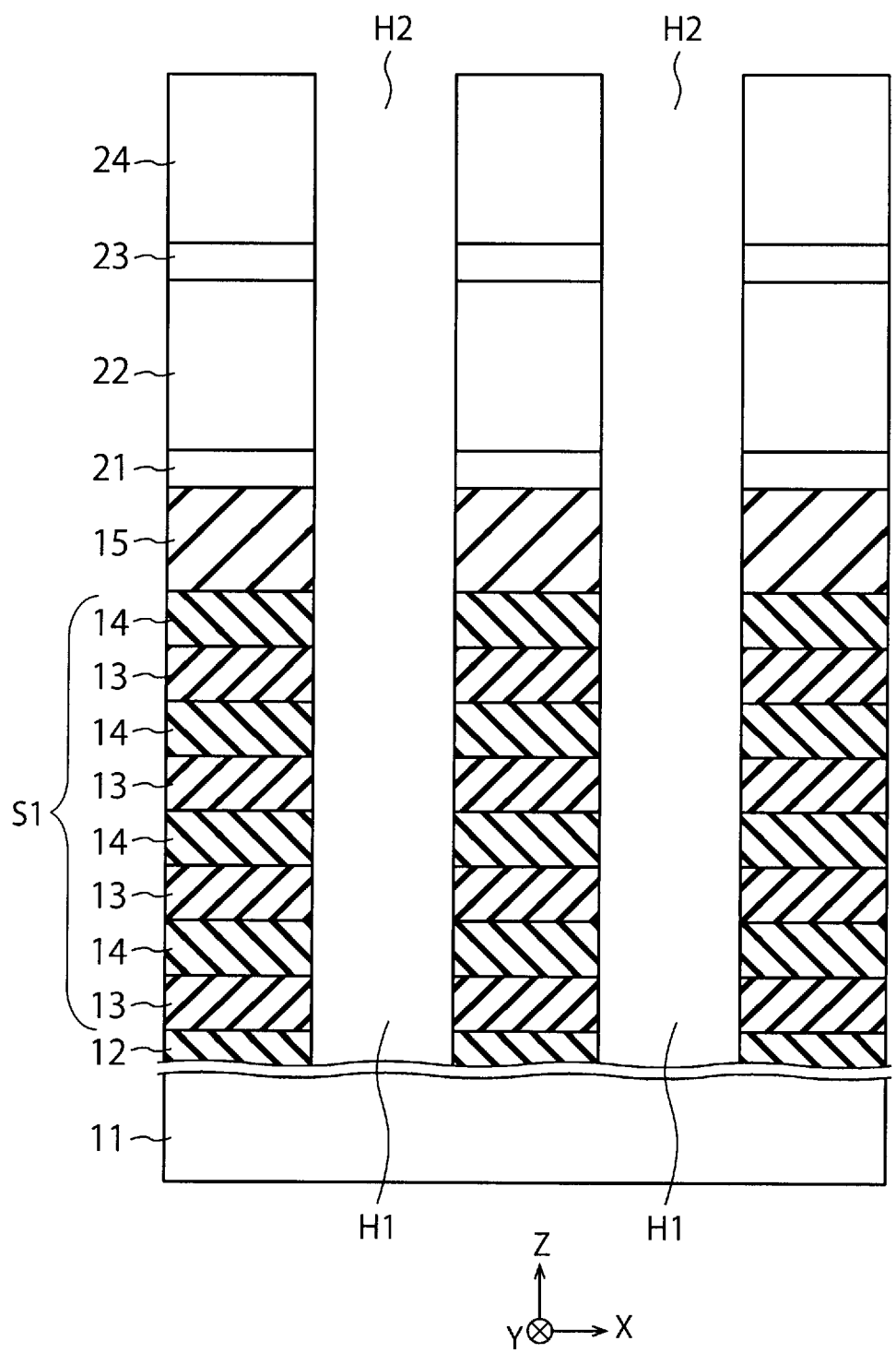
FIG. 5 is a sectional view (4/8) showing the method for producing the semiconductor device of the first embodiment.
Figure 6:
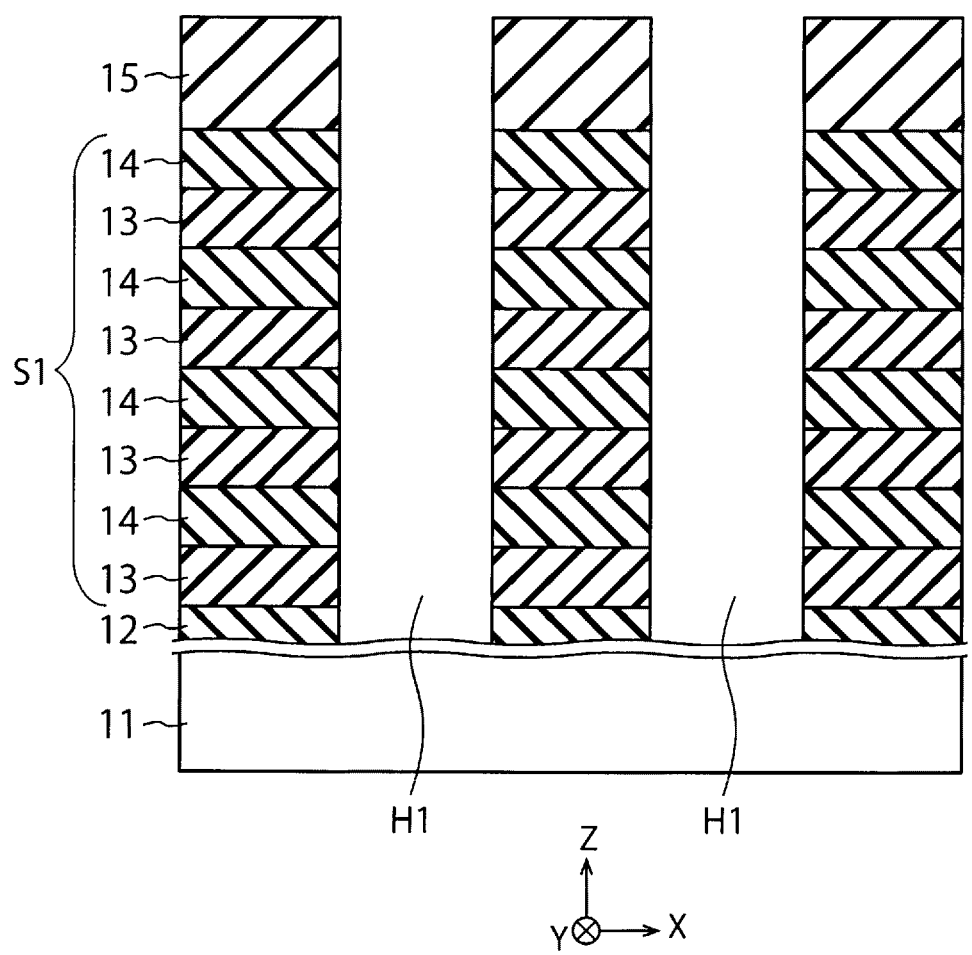
FIG. 6 is a sectional view (5/8) showing the method for producing the semiconductor device of the first embodiment.
Figure 7:
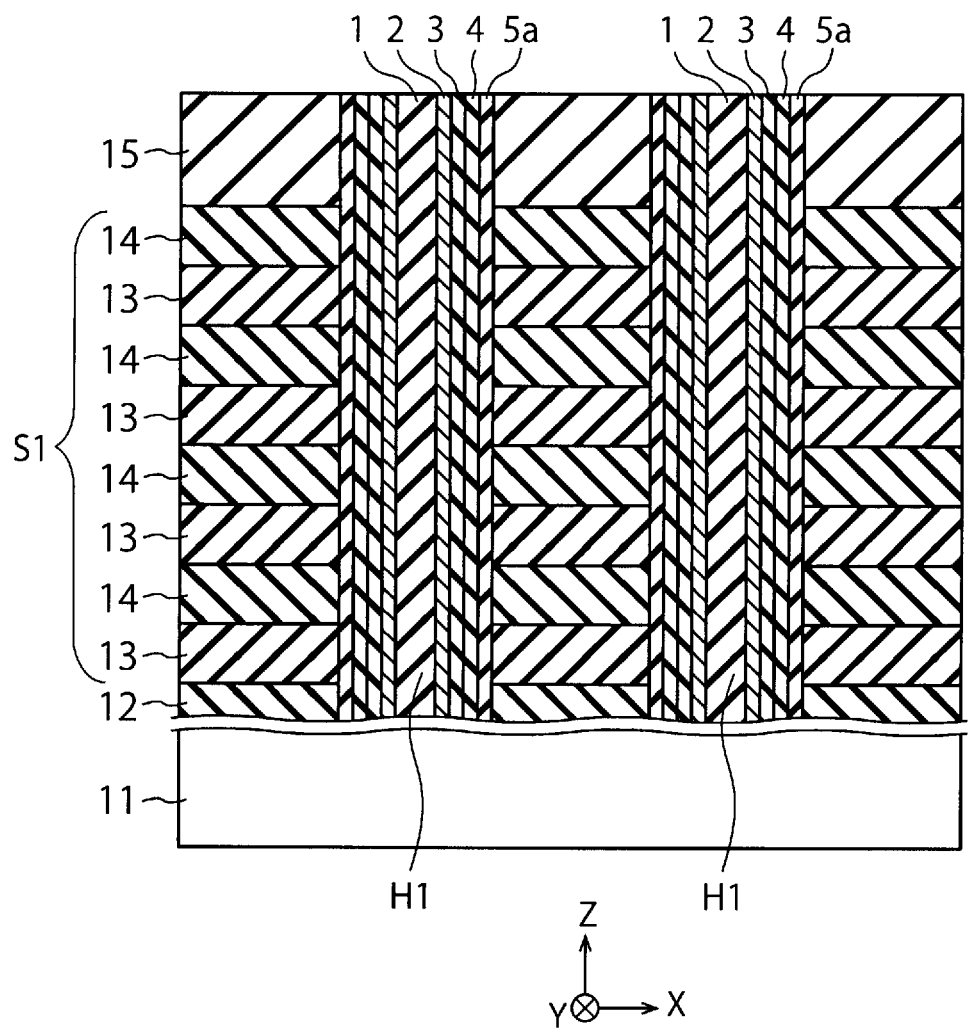
FIG. 7 is a sectional view (6/8) showing the method for producing the semiconductor device of the first embodiment.
Figure 8:
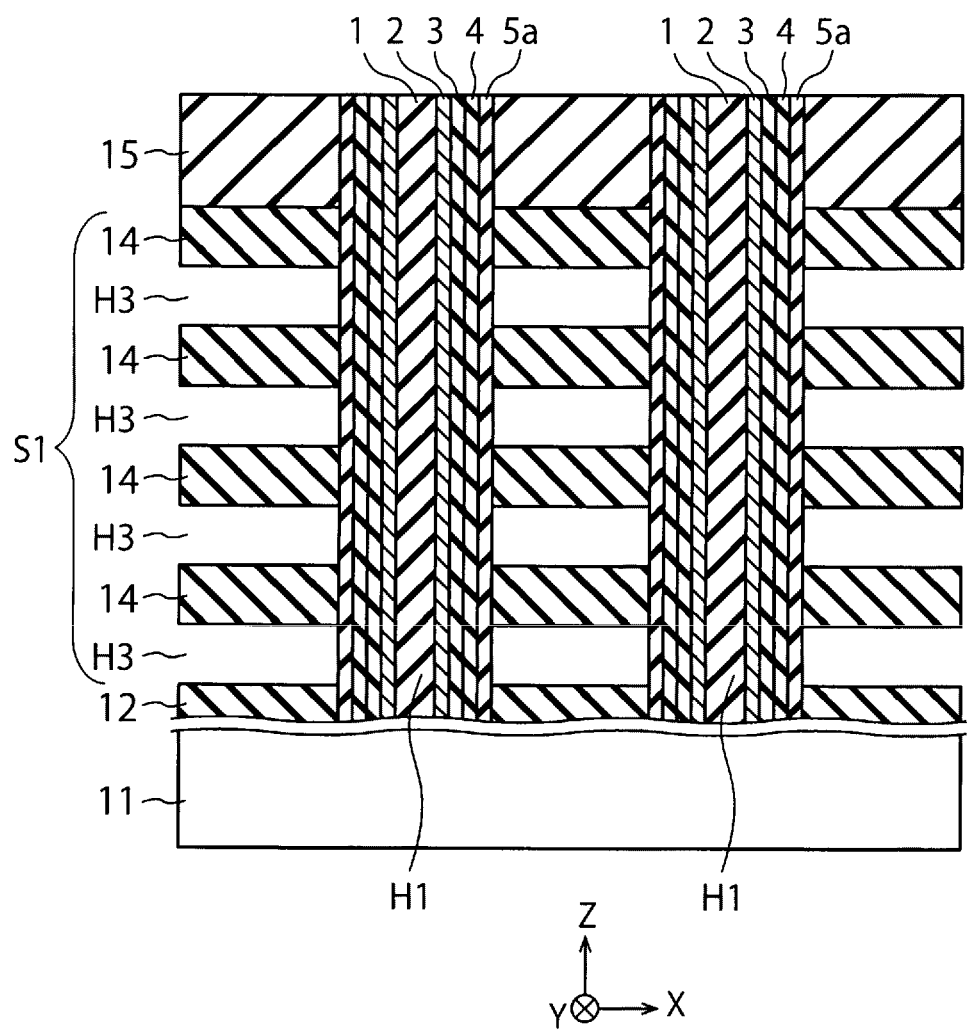
FIG. 8 is a sectional view (7/8) showing the method for producing the semiconductor device of the first embodiment.
Figure 9:
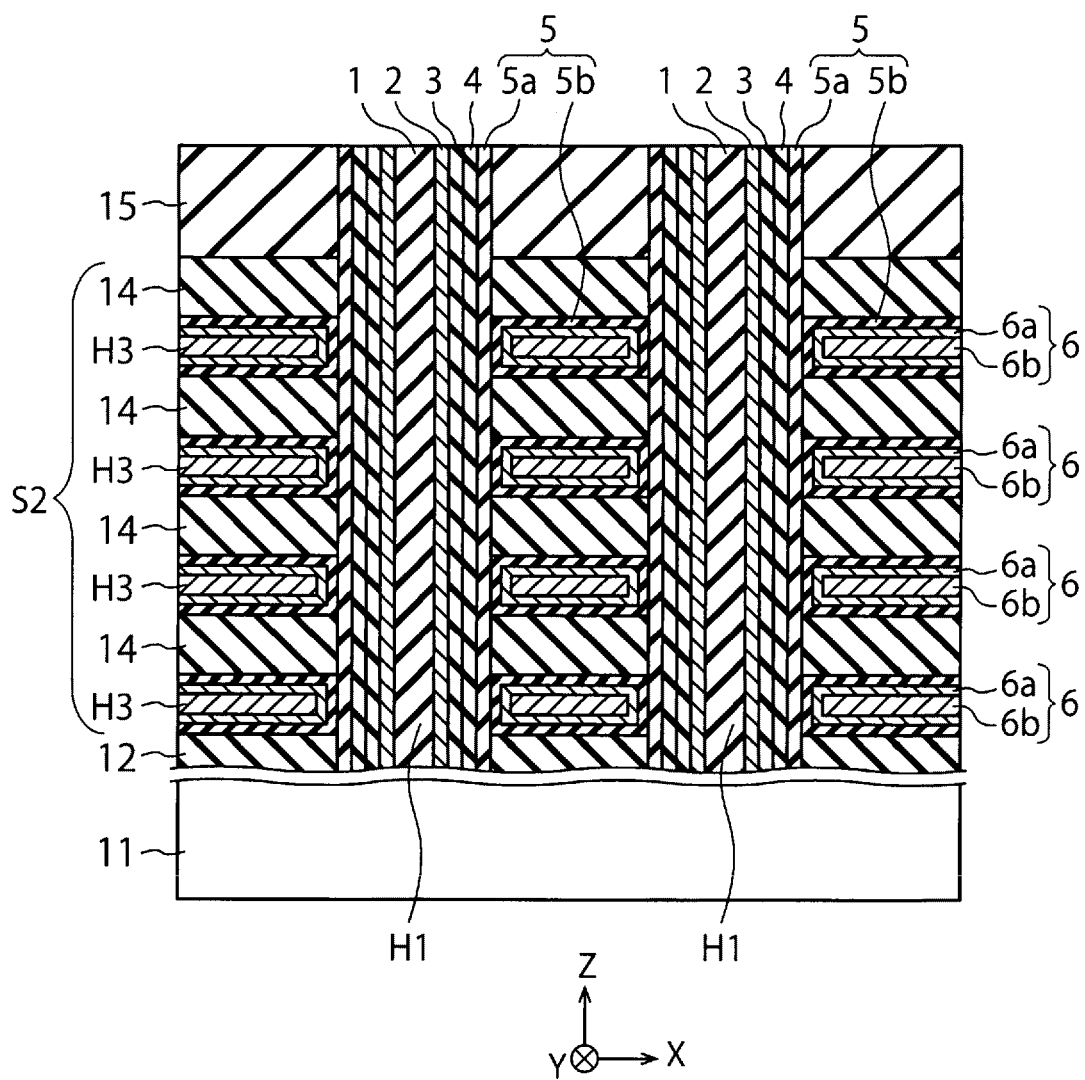
FIG. 9 is a sectional view (8/8) showing the method for producing the semiconductor device of the first embodiment.

Next, a glue layer 21, a body layer 22, a glue layer 23, a body layer 24, and a cover layer 25 are formed in turn on the interlayer insulating film 15 (FIG. 3). As will be described later, the glue layer 21, the body layer 22, the glue layer 23, the body layer 24, and the cover layer 25 of at least one embodiment are used as a hard mask layer for etching the interlayer insulating film 12, the stacked film S1, and the interlayer insulating film 15. The body layer 22 is an example of a first film and the body layer 24 is an example of a second film. Moreover, the glue layer 21 is an example of a third film and the glue layer 23 is an example of a fourth film. Furthermore, the cover layer 25 is an example of an insulating film.

The details of the body layer 22 will be described below.

The body layer 22 contains a metallic element, for example, and has tensile stress. Therefore, the body layer 22 has the property of causing the substrate 11 to be warped in a downward convex shape. The tensile stress of the body layer 22 ranges from +0.1 to +2.0 GPa, for example. The film thickness of the body layer 22 is 1.0 μm or less, for example. Examples of the above-described metallic element include tungsten (W), tantalum (Ta), zirconium (Zr), hafnium (Hf), molybdenum (Mo), niobium (Nb), ruthenium (Ru), osmium (Os), rhenium (Re), and iridium (Ir).

The body layer 22 of at least one embodiment is a metallic film containing the above-described metallic element and is a WBC film (B represents boron and C represents carbon), for example. This WBC film contains, for example, W atoms whose concentration is higher than 60 atom %, B atoms whose concentration ranges from 5 to 30 atom %, and C atoms whose concentration ranges from 10 to 35 atom %.

The body layer 22 containing a metallic element has an advantage in that, for example, it is possible to provide the body layer 22 with improved resistance to etching. Moreover, the body layer 22 containing boron has an advantage in that, for example, it is possible to remove the body layer 22 easily after the body layer 22 is used as the hard mask layer. Furthermore, the body layer 22 containing carbon has an advantage in that, for example, it is possible to prevent crystallization of the body layer 22. When the body layer 22 is a WB film, if the concentration of W atoms is higher than 60 atom %, there is a possibility of crystallization of the WB film. According to at least one embodiment, by forming the body layer 22 as a WBC film and making the WBC film contain a sufficient concentration of C atoms, it is possible to prevent crystallization of the WBC film.

Next, the details of the glue layer 21 will be described.

The glue layer 21 contains a metallic element, boron, or carbon, for example, and has a composition and/or chemical bond structure different from a composition and/or chemical bond structure of the body layer 22. The glue layer 21 of the present embodiment is a WBC film, for example. This WBC film contains, for example, W atoms whose concentration is higher than 40 atom %, B atoms whose concentration ranges from 5 to 30 atom %, and C atoms whose concentration ranges from 10 to 35 atom %. When the glue layer 21 and the body layer 22 are both WBC films, it is preferable to set the concentration (atom %) of W atoms in the glue layer 21 to be lower than the concentration (atom %) of W atoms in the body layer 22. Moreover, the glue layer 21 of at least one embodiment may be a BC film, for example. The film thickness of the glue layer 21 is about 10 nm, for example.

The glue layer 21 of at least one embodiment is formed to provide adhesion between the stacked film S1 and the body layer 22. The glue layer 21 may be a film other than a film containing a metallic element, boron, or carbon as long as the glue layer 21 can provide adhesion between the stacked film S1 and the body layer 22.

Next, the details of the body layer 24 will be described.

The body layer 24 contains at least one of carbon and boron, for example, and has compressive stress. Therefore, the body layer 24 has the property of causing the substrate 11 to be warped in an upward convex shape. The compressive stress of the body layer 24 ranges from −0.1 to −2.0 GPa, for example. The film thickness of the body layer 24 is 5.0 μm or less, for example. In at least one embodiment, the composition of the body layer 24 is different from the composition of the body layer 22.

The body layer 24 of at least one embodiment is a nonmetallic film containing at least one of carbon and boron and is a C film, a BC film, a BN film, or a BCN film (N represents nitrogen), for example. The above-described body layer 24 may further contain hydrogen. In this case, the body layer 24 is, for example, a C film, a BC film, a BN film, or a BCN film, which contains H atoms (H represents hydrogen) as impurity atoms.

The above-described C film contains, for example, C atoms whose concentration is higher than 70 atom % and H atoms whose concentration is lower than 30 atom %. The above-described BC film contains, for example, B atoms whose concentration ranges from 30 to 80 atom %, C atoms whose concentration ranges from 10 to 30 atom %, and H atoms whose concentration is lower than 50 atom %. The above-described BN film contains, for example, B atoms whose concentration ranges from 30 to 80 atom %, N atoms whose concentration ranges from 10 to 40 atom %, and H atoms whose concentration is lower than 50 atom %. The above-described BCN film contains, for example, B atoms whose concentration ranges from 30 to 80 atom %, C atoms whose concentration ranges from 10 to 30 atom %, N atoms whose concentration ranges from 10 to 40 atom %, and H atoms whose concentration is lower than 50 atom %.

When the body layer 24 is a C film, the body layer 24 preferably contains a carbon $sp^3$ structure and preferably contains both a carbon $sp^2$ structure and a carbon $sp^3$ structure, for example. The $sp^2$ structure is the structure of C atoms in graphite and the $sp^3$ structure is the structure of C atoms in diamond. The body layer 24 of at least one embodiment is preferably a hard layer because the body layer 24 is used as the hard mask layer. For this reason, in the body layer 24 of at least one embodiment, the $sp^3$ structures make up preferably 10% or more, and more preferably more than 50% of the total of the $sp^2$ structures and the sp³ structures. This makes it possible to form the body layer 24 as a diamond-like C film and form the body layer 24 as a hard C film.

When the body layer 24 is a C film, the percentage of the sp³ structures in the body layer 24 can be measured using Raman spectroscopy. Specifically, the higher the percentage of the sp³ structures in the body layer 24, the lower the Id/Ig ratio in Raman spectroscopy of the body layer 24. The Id/Ig ratio is the ratio between the peak intensity (Id) of the D band and the peak intensity (Ig) of the G band. For example, when the Id/Ig ratio is less than 1.0 and the G position is lower than 1570 cm$^{-1}$, the percentage of the spa structures is more than 10%. In at least one embodiment, it is preferable to set the Id/Ig ratio in Raman spectroscopy of the body layer 24 to be less than 1.0.

The body layer 24 of at least one embodiment preferably has a high density because the body layer 24 is used as the hard mask layer. For this reason, the density of the body layer 24 of at least one embodiment is preferably higher than 2.0 g/cm³ and preferably higher than 2.4 g/cm³, for example. When the body layer 24 is a C film, by setting the density of the body layer 24 so as to be higher than 2.0 g/cm³, it is possible to form a diamond-like C film.

As described above, instead of being formed as a C film, the body layer 24 may be formed as a film containing B atoms; for example, the body layer 24 may be formed as a BC film, a BN film, or a BCN film. The body layer 24 containing B atoms has an advantage in that, for example, it is possible to provide the body layer 24 with improved resistance to etching. When the body layer 24 contains B atoms and C atoms, it is preferable to set the concentration (atom %) of B atoms in the body layer 24 to be higher than the concentration (atom %) of C atoms in the body layer 24.

Next, the details of the glue layer 23 will be described.

The glue layer 23 contains at least one of carbon or boron, for example, and has a composition and/or chemical bond structure different from the composition and/or chemical bond structure of the body layer 24. The glue layer 23 of the at least one embodiment is a C film, a BC film, a BN film, or a BCN film, for example. The above-described glue layer 23 may further contain hydrogen. In this case, the glue layer 23 is, for example, a C film, a BC film, a BN film, or a BCN film, which contains H atoms as impurity atoms. The film thickness of the glue layer 23 is about 10 nm, for example.

The glue layer 23 of the at least one embodiment is formed in order to provide adhesion between the body layer 22 and the body layer 24. The glue layer 23 may be a film other than a film containing at least one of carbon or boron as long as the glue layer 23 can provide adhesion between the body layer 22 and the body layer 24.

When the glue layer 23 is a C film, the glue layer 23 preferably contains a carbon sp² structure and preferably contains both a carbon sp² structure and a carbon spa structure, for example. Since the glue layer 23 of at least one embodiment is formed in order to provide adhesion between the body layer 22 and the body layer 24, the glue layer 23 formed as a graphite-like C film is preferable to the glue layer 23 formed as a diamond-like C film. For this reason, in the glue layer 23 of at least one embodiment, the sp³ structures preferably make up a smaller percentage of the sp² structures and the sp³ structures than in the body layer 24. Specifically, in the glue layer 23 of at least one embodiment, the sp³ structures make up preferably less than 50%, and preferably less than 30%, for example, of the sp² structures and the sp³ structures. This makes it possible to form the glue layer 23 as a graphite-like C film and form the glue layer 23 which is suitable for providing the above-described adhesion.

In at least one embodiment, the body layer 24 may be formed directly on the body layer 22 without the glue layer 23 formed therebetween. In this case, it is preferable to form the body layer 24 on the body layer 22 after treating the upper surface of the body layer 22 by plasma treatment using NH₃. This makes it possible to provide adhesion between the body layer 22 and the body layer 24 without the glue layer 23 formed therebetween.

In this case, it is preferable to perform plasma treatment of the body layer 22 and the formation of the body layer 24 consecutively in the same apparatus. This makes it possible to eliminate the need to convey the substrate 11 to the outside of the apparatus between the plasma treatment of the body layer 22 and the formation of the body layer 24. This apparatus is a plasma enhanced chemical vapor deposition (PECVD) apparatus, for example. In this case, the body layer 22 is treated with plasma generated in the PECVD apparatus and the body layer 24 is formed by PECVD.

Next, the details of the cover layer 25 will be described.

The cover layer 25 is a film containing silicon (Si) and is an insulating film such as a SiO₂ film, a SiON film, or a SiN film, for example. The cover layer 25 of at least one embodiment may have a tensile stress or a compressive stress. The stress of the cover layer 25 ranges from +1.0 to −1.0 GPa, for example. The cover layer 25 of at least one embodiment may be a tetraethyl orthosilicate (TEOS) film. The film thickness of the cover layer 25 is 1.0 μm or less, for example.

As described above, the hard mask layer of at least one embodiment includes the body layer 22 containing a metallic element. According to at least one embodiment, since the body layer 22 contains a metallic element, it is possible to provide the hard mask layer with improved resistance to etching. However, as described earlier, the body layer 22 has tensile stress. Therefore, when the hard mask layer includes the body layer 22, the substrate 11 may be warped in a downward convex shape. Warpage of the substrate 11 can cause, for example, a conveyance error of the substrate 11 or a defect in a structure which is formed on the substrate 11.

To address this problem, the hard mask layer of at least one embodiment includes the body layer 22 containing a metallic element and the body layer 24 containing at least one of carbon or boron. This makes it possible to increase the film thickness of the hard mask layer by the thickness of the body layer 24 and further enhance the performance (the mask performance) of the hard mask layer as an etching mask. Furthermore, as described earlier, the body layer 24 has compressive stress. This makes it possible to cancel out the action of the tensile stress of the body layer 22 on the substrate 11 by the action of the compressive stress of the body layer 24 on the substrate 11. Therefore, according to at least one embodiment, since the hard mask layer includes the body layer 22 and the body layer 24, it is possible to prevent warpage of the substrate 11 while enhancing the mask performance of the hard mask layer.

When there is a stress difference between the tensile stress of the body layer 22 and the compressive stress of the body layer 24, this stress difference may be canceled out by the stress of the cover layer 25. This makes it possible to prevent warpage of the substrate 11 more effectively.

As will be described later, the hard mask layer of at least one embodiment is used to form the memory hole H1 in the interlayer insulating film 12, the stacked film S1, and the interlayer insulating film 15. When the scale of integration of the NAND memory is increased and the stacked film S1 increases in thickness, further enhancement of the mask performance of the hard mask layer is needed. However, the problem is that an attempt to enhance the mask performance of the hard mask layer by simply increasing the film thickness of the body layer 22 makes the body layer 22 cause the substrate 11 to be warped. According to at least one embodiment, since the hard mask layer includes the body layer 22 and the body layer 24, even when the stacked film S1 increases in thickness, it is possible to enhance the mask performance of the hard mask layer while preventing warpage of the substrate 11. According to at least one embodiment, it is possible to provide the hard mask layer that has a high selection ratio in spite of its small film thickness, which also makes it possible to reduce the film thickness of the hard mask layer and shorten the time required to form and treat the hard mask layer.

The glue layer 21, the body layer 22, the glue layer 23, the body layer 24, and the cover layer 25 of at least one embodiment can be formed by PECVD, for example. In this case, these layers may be consecutively formed in the above-described PECVD apparatus.

Hereinafter, the description of the method for producing the semiconductor device of at least one embodiment is resumed using FIGS. 4 to 9.

Next, the cover layer 25, the body layer 24, the glue layer 23, the body layer 22, and the glue layer 21 are processed by photolithography and reactive ion etching (RIE) (FIG. 4), whereby a plurality of holes H2 are formed in these layers. These holes H2 pass through the cover layer 25, the body layer 24, the glue layer 23, the body layer 22, and the glue layer 21 and reach the interlayer insulating film 15. The cover layer 25 may disappear during the process of FIG. 4 or may be removed after the process of FIG. 4.

When the body layer 24 and the glue layer 23 are C films, the body layer 24 and the glue layer 23 are processed using COS gas or $O_2$ gas (O represents oxygen and S represents sulfur), for example. Moreover, when the body layer 22 and the glue layer 21 are WBC films, the body layer 22 and the glue layer 21 are processed using $Cl_2$ gas, $O_2$ gas, or $SiCl_4$ gas (Cl represents chlorine), for example. When the body layer 22 and the glue layer 21 are processed using $SiCl_4$ gas, it is possible to protect the side surfaces of the body layer 24 and the glue layer 23 (the C films), which are exposed in the holes H2, with $SiCl_4$ gas.

Next, the interlayer insulating film 15, the stacked film S1, and the interlayer insulating film 12 are processed from the holes H2 by RIE (FIG. 5), whereby the holes H2 are transferred to the interlayer insulating film 15, the stacked film S1, and the interlayer insulating film 12 and a plurality of memory holes H1 are formed in the interlayer insulating film 15, the stacked film S1, and the interlayer insulating film 12. That is, the interlayer insulating film 15, the stacked film S1, and the interlayer insulating film 12 are processed using the body layer 24, the glue layer 23, the body layer 22, and the glue layer 21 as a mask. Each of the body layer 24, the glue layer 23, the body layer 22, and the glue layer 21 may disappear during the process of FIG. 5 or may be removed after the process of FIG. 5 (see FIG. 6).

Next, in each memory hole H1, the insulating film 5a, the charge storage layer 4, the tunnel insulating film 3, the channel semiconductor layer 2, and the core insulating film 1 are formed in turn (FIG. 7), whereby the insulating film 5a, the charge storage layer 4, the tunnel insulating film 3, the channel semiconductor layer 2, and the core insulating film 1 are formed in turn on the side surfaces of the interlayer insulating film 15, the stacked film S1, and the interlayer insulating film 12 in each memory hole H1.

Next, a slit (which is not shown in the drawing) is formed in the interlayer insulating film 15, the stacked film S1, and the interlayer insulating film 12 and the sacrifice layers 13 are removed by a chemical solution, such as phosphoric acid, through the slit (FIG. 8), whereby a plurality of cavities H3 are formed between the insulating layers 14.

Next, the insulating film 5b, the barrier metal layer 6a, and the electrode material layer 6b are formed in turn on the front surfaces of the insulating layers 14 and the insulating films 5a in these cavities H3 (FIG. 9), whereby the block insulating films 5, each including the insulating film 5a and the insulating film 5b, are formed. Furthermore, in each cavity H3, the electrode layer 6 including the barrier metal layer 6a and the electrode material layer 6b is formed. In this way, a stacked film S2 alternately including the electrode layers 6 and the insulating layers 14 is formed on the interlayer insulating film 12. Forming the insulating films 5b, the barrier metal layers 6a, and the electrode material layers 6b after removing the sacrifice layers 13 is referred to as a replacement process.

Then, various plug layers, wiring layers, interlayer insulating films, and so forth are formed on the substrate 11. In this way, the semiconductor device of at least one embodiment is produced (see FIG. 1).

As described above, the interlayer insulating film 15, the stacked film S1, and the interlayer insulating film 12 of at least one embodiment are processed using the hard mask layer including the body layer 22 containing a metallic element (for example, tungsten) and the body layer 24 containing at least one of carbon and boron. Therefore, according to at least one embodiment, it is possible to prevent warpage of the substrate 11 which is caused by the hard mask layer.

The hard mask layer of at least one embodiment may be used to form an opening other than the memory hole H1. Examples of this opening include a hole other than the memory hole H1 and a trench or slit which extends in an in-plane direction of the substrate 11.

Moreover, the hard mask layer of at least one embodiment may be used to process a film other than the stacked film S1. For example, when the replacement process is not performed, the hard mask layer of at least one embodiment may be used to process the stacked film S2 alternately including the electrode layers 6 and the insulating layers 14.

Second Embodiment

Figure 10:
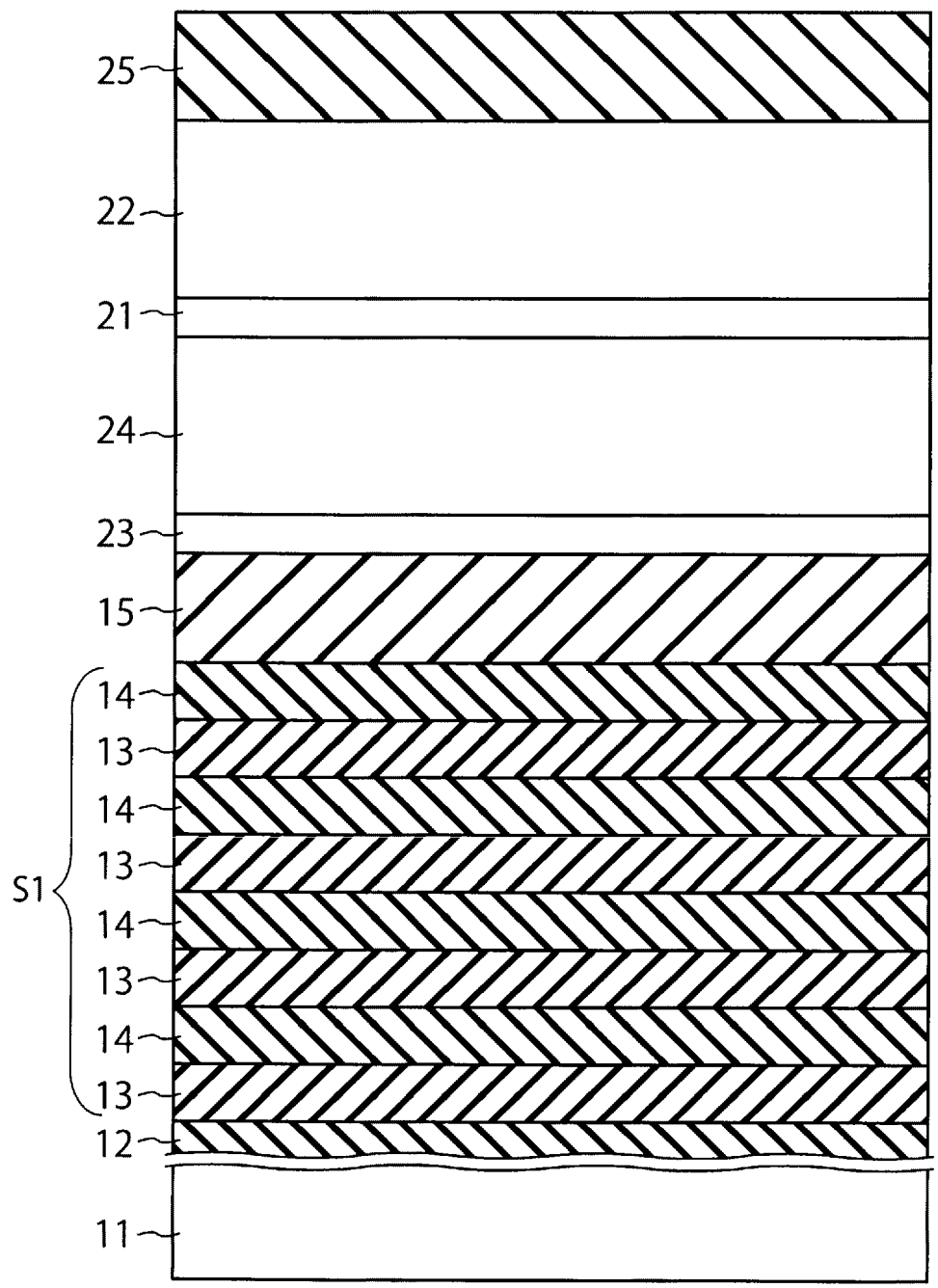
FIG. 10 is a sectional view showing a method for producing a semiconductor device of a second embodiment.

FIG. 10 is a sectional view showing a method for producing a semiconductor device of a second embodiment. The method for producing the semiconductor device of at least one embodiment is a modified example of the method for producing the semiconductor device of the first embodiment.

First, the process of FIG. 2 is performed, whereby the interlayer insulating film 12, the stacked film S1, and the interlayer insulating film 15 are formed in turn on the substrate 11.

Next, the glue layer 23, the body layer 24, the glue layer 21, the body layer 22, and the cover layer 25 are formed in turn on the interlayer insulating film 15 (FIG. 10). As described above, in at least one embodiment, the glue layer 23 and the body layer 24 are first formed and the glue layer 21 and the body layer 22 are then formed. Thus, the glue layer 23 and the body layer 24 are formed in a lower part and the glue layer 21 and the body layer 22 are formed in an upper part. For the details of these layers, refer to the relevant portions of the explanation of FIG. 3. The body layer 22 is an example of the first film and the body layer 24 is an example of the second film. Moreover, the glue layer 21 is an example of the third film and the glue layer 23 is an example of the fourth film. Furthermore, the cover layer 25 is an example of the insulating film.

Next, the processes from FIGS. 4 to 9 are performed. When the processes from FIGS. 4 to 9 are applied to the present embodiment, processing related to the glue layer 23 and the body layer 24 and processing related to the glue layer 21 and the body layer 22 are performed in reverse order. For example, the holes H2 pass through the body layer 22, the glue layer 21, the body layer 24, and the glue layer 23 in turn.

Then, various plug layers, wiring layers, interlayer insulating films, and so forth are formed on the substrate 11. In this way, the semiconductor device of at least one embodiment is produced. According to at least one embodiment, as in the first embodiment, the semiconductor device having a structure shown in FIG. 1 is produced.

As described above, the interlayer insulating film 15, the stacked film S1, and the interlayer insulating film 12 of at least one embodiment are processed using the hard mask layer including the body layer 24 containing at least one of carbon and boron and the body layer 22 containing a metallic element (for example, tungsten). Therefore, according to at least one embodiment, as in the first embodiment, it is possible to prevent warpage of the substrate 11 which is caused by the hard mask layer.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for producing a semiconductor device, comprising:
    forming, on a substrate, a third film to be processed;
    forming, on the third film, (i) a first film containing a metallic element and (ii) a second film containing at least one of carbon or boron;
    forming an insulating film on the first and second films; and
    processing the third film using, as a mask, the first film, the second film, and the insulating film,
    wherein the first film has a tensile stress and the second film has a compressive stress.

2. The method according to claim 1, wherein a composition of the second film is different from a composition of the first film.

3. The method according to claim 1, wherein the second film is formed on the first film.

4. The method according to claim 1, wherein the first film is formed on the second film.

5. The method according to claim 1, wherein the first film further includes boron and carbon.

6. The method according to claim 1, wherein the second film contains carbon and hydrogen.

7. The method according to claim 1, wherein the second film contains boron and hydrogen.

8. The method according to claim 7, wherein the second film further contains at least one of carbon or nitrogen.

9. The method according to claim 1, wherein a density of the second film is higher than 2.0 g/cm$^3$.

10. The method according to claim 1, wherein the second film contains a carbon sp$^2$ structure and a carbon sp$^3$ structure, and
    in the second film, the sp$^3$ structures make up 10% or more of a sum total of the sp$^2$ structures and the sp$^3$ structures.

11. The method according to claim 1, wherein an Id/Ig ratio in Raman spectroscopy of the second film is less than 1.0.

12. The method according to claim 1, wherein the first film is formed on a fourth film, the fourth film containing the metallic element, boron, or carbon, and the second film is formed on a fifth film containing at least one of carbon or boron.

13. The method according to claim 12, wherein the fourth film has a composition different from a composition of the first film.

14. The method according to claim 12, wherein the fifth film contains a carbon sp$^2$ structure and a carbon sp$^3$ structure, and
    in the fifth film, the sp$^3$ structures make up a smaller percentage of a sum total of the sp$^2$ structures and the sp$^3$ structures than in the second film.

15. The method according to claim 1, wherein the second film is a carbon film having a density greater than 2.4 g/cm$^3$.

16. The method according to claim 1, wherein the second film contains carbon and boron, the atom % of the boron being greater than the atom % of the carbon.

17. A method for producing a semiconductor device, comprising:
    forming, on a substrate, a third film to be processed;
    forming, on the third film, a first film having a tensile stress and a second film having a compressive stress;
    forming an insulating film on the first and second films; and
    processing the third film using, as a mask, the first film, the second film, and the insulating film.

18. The method according to claim 17, wherein the tensile stress of the first film is at least +0.1 GPa and not more than +2.0 GPa, and
    the compressive stress of the second film is at least −0.1 GPa and not more than −2.0 GPa.

19. The method according to claim 17, wherein the first film contains a metallic element and the second film contains at least one of carbon or boron.

* * * * *